US007280469B2

(12) United States Patent
Jin (10) Patent No.: US 7,280,469 B2
(45) Date of Patent: Oct. 9, 2007

(54) EFFICIENT IMPLEMENTATION OF LARGE SIZE FFT

(76) Inventor: Gary Q. Jin, 51 Liston Cres., Kanata, Ontario (CA) K2L 2W3

(*) Notice: Subject to any disclaimer, the term of this patent is extended or adjusted under 35 U.S.C. 154(b) by 782 days.

(21) Appl. No.: 09/942,628

(22) Filed: Aug. 31, 2001

(65) Prior Publication Data

US 2002/0031083 A1 Mar. 14, 2002

(30) Foreign Application Priority Data

May 9, 2000 (GB) .................................. 0021708.3

(51) Int. Cl.
*H04J 11/00* (2006.01)
*H04B 7/208* (2006.01)
(52) U.S. Cl. ...................... 370/210; 370/344; 370/488; 370/497
(58) Field of Classification Search ................ 370/203, 370/208, 210, 343, 344, 480, 487, 488, 497, 370/503
See application file for complete search history.

(56) References Cited

U.S. PATENT DOCUMENTS

| | | | |
|---|---|---|---|
| 4,720,674 A | 1/1988 | Takeuchi et al. | |
| 5,528,581 A * | 6/1996 | De Bot | 370/203 |
| 5,587,939 A | 12/1996 | Soleymani et al. | |
| 5,699,363 A * | 12/1997 | Wishart et al. | 370/497 |
| 5,867,479 A | 2/1999 | Butash | 370/210 |
| 6,091,704 A | 7/2000 | Butash | 370/210 |
| 6,317,409 B1 * | 11/2001 | Murakami | 370/203 |
| 6,442,195 B1 * | 8/2002 | Liu et al. | 375/220 |
| 6,456,657 B1 * | 9/2002 | Yeap et al. | 375/240.12 |
| 6,473,467 B1 * | 10/2002 | Wallace et al. | 375/267 |
| 6,690,717 B1 * | 2/2004 | Kim et al. | 375/219 |

FOREIGN PATENT DOCUMENTS

GB 2 317 537 A 3/1998

* cited by examiner

*Primary Examiner*—Afsar Qureshi

(57) ABSTRACT

A system and method of implementing a Fast Fourier Transform (FFT) function in a high data rate communication network. The communication network, employing technology such as VDSL and DMT or FDM, frequently implements a FFT at a transmitter to transfer frequency domain modulated signals into time domain signals. An IFFT is implemented at the receiver to obtain the original signal. The present system divides the channel bandwidth into sub-bands and performs the FFT function with multiple FFTs in order to reduce chip size and computation time.

33 Claims, 6 Drawing Sheets

EFFICIENT IMPLEMENTATION OF LARGE SIZE FFT

FIELD OF THE INVENTION

This invention relates to Fast Fourier Transform (FFT) implementation and in particular to a system for efficiently implementing a FFT in a high data rate communication system.

BACKGROUND

The ever increasing demand for high bandwidth services to homes and private enterprises has prompted ongoing investigations into methods of meeting these demands. It is well known that optical fiber links can propagate the required bandwidth for providing real time services such as voice and video. Progress in the installation of fiber to each and every home has been delayed due to the extreme costs associated with providing and connecting the necessary optical cables. For this reason efforts have been extended into finding ways of making use of the ubiquitous twisted copper pair which connects virtually every home to the Public Switch Telephone Network (PSTN).

Technologies such as Asynchronous Digital Subscriber Line (ADSL) have been successful in transferring signals in the low Mbps data rate over distances of a few thousand meters. There is, however, a need to deliver higher data rates for improved multimedia services and these needs can be met by a combination of optical cable and the twisted copper pair. Programs which introduce technologies like FTTN (fiber to the neighborhood) have meant that optical fibers are connected from a central office to one or more locations within a neighborhood or apartment building and the twisted copper pair is used to connect from this termination to the customer premises equipment. This reduces the transmission distance to a few hundred meters or more. It has been established that Very High Rate Digital Subscriber Line (VDSL) technology can transmit much higher data rates albeit over a shorter distance. At present data rates in the 13 mbps to 55 mbps can be achieved using VDSL technology.

VDSL technology typically uses discrete multi-tone (DMT) and Fast Fourier Transform (FFT) technologies. In such systems the available bandwidth is used to carry multiple channels of information and a Fast Fourier Transform (FFT) is typically used to convert frequency domain modulated signals into time domain signals. In this technology a transmitter at the local Neighborhood Termination (NT) receives the data from the central office and converts it through an Inverse FFT function into a form for downloading on the twisted copper pair. At the receiver a Fast Fourier Transform function is used to obtain the original frequency signal. For large channel bandwidths with a large number of subchannels being used such as in the VDSL application, the FFT size, by necessity, is very large. This introduces two main drawbacks which make the DMT application in VDSL almost impractical. The first is tat the FFT size is very large and this impacts from a chip design perspective and the second is that the execution of the function will take a long time. Accordingly, there is a requirement to develop a system for the efficient implementation of an FFT in DMT applications.

SUMMARY OF THE INVENTION

It is an objection of the present invention to overcome the aforementioned problem by replacing one large size FFT with a few small sized FFTs. In this way, both computation time and chip size are reduced, especially for FDM applications, when only part of the frequency band is used for data transmission.

Therefore, in accordance with a first aspect of the present invention, there is provided a broad bandwidth, high data rate communications system comprising a transmitter employing Inverse Fast Fourier Transform and a receiver employing Fast Fourier Transform, the transmitter having means for dividing the bandwidth into a plurality of sub-bands each for a respective one of a corresponding plurality of sub-band signals, each of the sub-band signals being modulated with a respective portion of input data to be transmitted; and means for performing Inverse Fast Fourier Transform (IFFT) upon the sub-band signals using, for each sub-band signal, a respective one of a plurality of different IFFTs, combining the transformed sub-band signals and transmitting the combined transformed signals to the receiver;

the receiver having means for receiving the combined transformed sub-band signals, separating the sub-band signals and performing forward Fast Fourier Transform thereupon individually using, for each transformed sub-band signal, a respective one of a plurality of different FFTs corresponding to those in the transmitter.

In accordance with a second aspect of the present invention there is provided a transmitter for use in a broad bandwidth, high data rate communications system employing Fast Fourier Transform, the transmitter having means for dividing the bandwidth into a plurality of sub-bands each for a respective one of a corresponding plurality of sub-band signals, each of the sub-band signals being modulated with a respective position of input data to be transmitted; and means for performing Inverse Fast Fourier Transform (IFFT) upon the sub-band signals using, for each sub-band signal, a respective one of a plurality of different IFFTs, combining the transformed sub-band signals and transmitting the combined transformed signals.

In accordance with a third aspect of the present invention, there is provided a receiver for use in a broad bandwidth, high data rate communications system, in which transmitted signals are divided into sub-bands and converted using, for each sub-band signal, a respective one of a plurality of Inverse Fast Fourier Transforms (IFFTs), the receiver having:

means for receiving and separating a plurality of sub-band signals in said corresponding plurality of sub-bands;

and means for performing Fast Fourier Transform upon the received sub-band signals using, for each sub-band signal, a respective one of a plurality of different FFTs corresponding to the IFFTs.

Other aspects of the present invention concern methods corresponding to the first, second and third aspects, respectively.

BRIEF DESCRIPTION OF THE DRAWINGS

The invention will now be described in greater detail with reference to the attached drawings wherein.

DETAILED DESCRIPTION OF THE INVENTION

Figure 1:
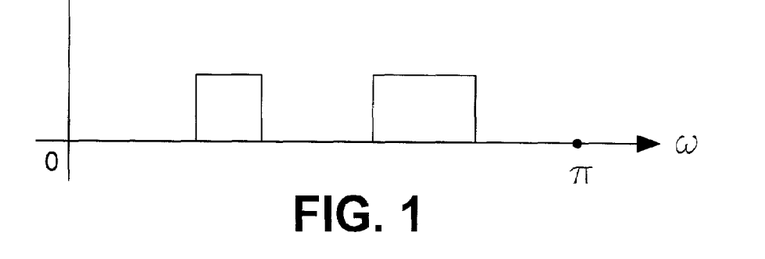
FIG. 1 illustrates a typical transmit signal spectrum in a "prior art" FDM system.
Figure 2A:
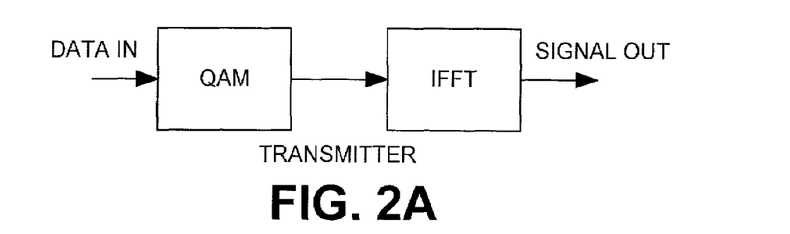
FIGS. 2(a) and 2(b) are block diagrams of a transmitter and receiver respectively according to the prior art.
Figure 2B:
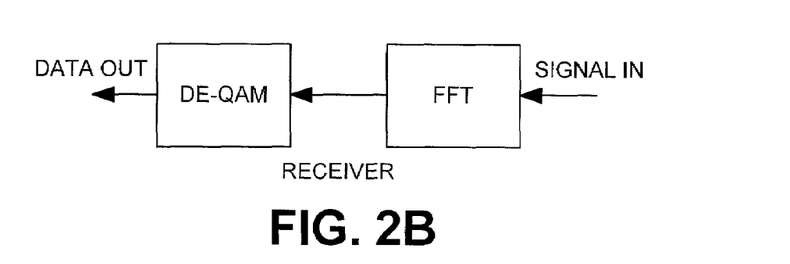

In a typical DMT based system, an N point IFFT is used to transform N frequency subchannel carriers, with quadrative amplitude modulation (QAM) modulated data, into N point time domain samples. FIG. 1 labelled "PRIOR ART", shows a typical transmit signal spectrum when frequency division multiplexing (FDM) is being used. The implementation is relatively simple; data is first modulated onto subchannel carriers using QAM modulation and the N point IFFFT is applied. At the receiver end, FFT is applied first and then QAM demodulation is used to get the original data. The transmitter and receiver block diagrams are shown in FIG. 2.

The problem with the above implementation is that both computation and chip size will be very large. In typical VDSL applications, for example, N=8192. Also, if FDM is used in VDSL, only approximately half of the bandwidth is used for either down stream or up stream data transmission. Performing IFFT on the whole frequency band is a waste for both computation and clip size. In the following, a modification scheme is used where several small size FFTs are used instead of one big FFT.

Figure 3:
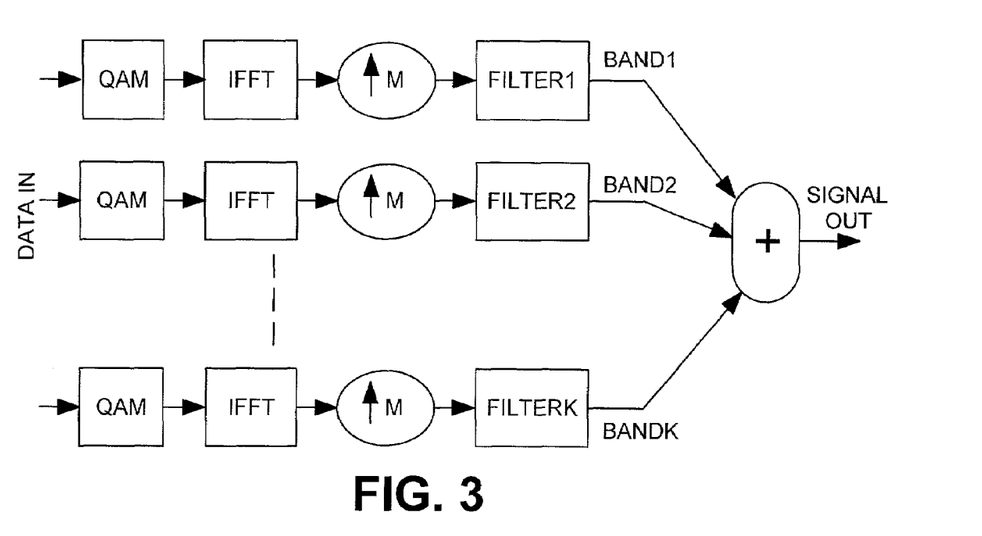
FIG. 3 shows a transmitter implementation according to the present invention.
Figure 4:
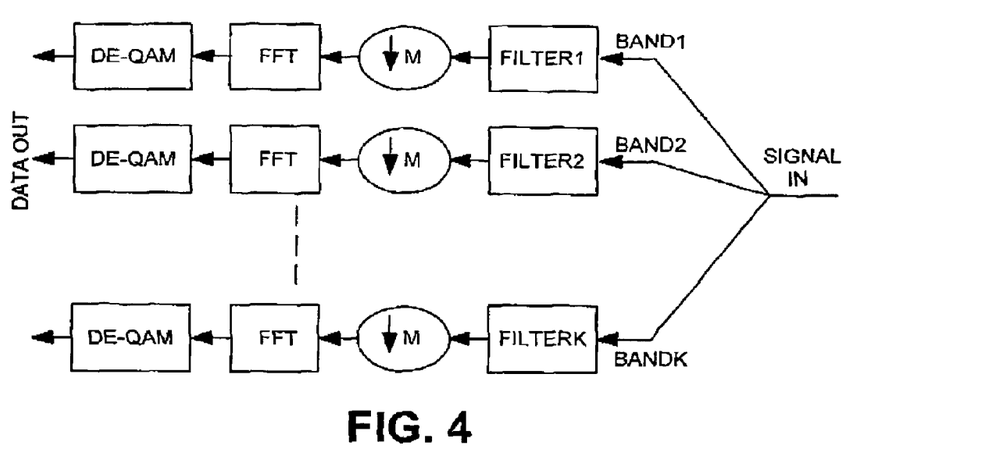
FIG. 4 shows a data receiver implementation of the present invention.
Figure 5A:
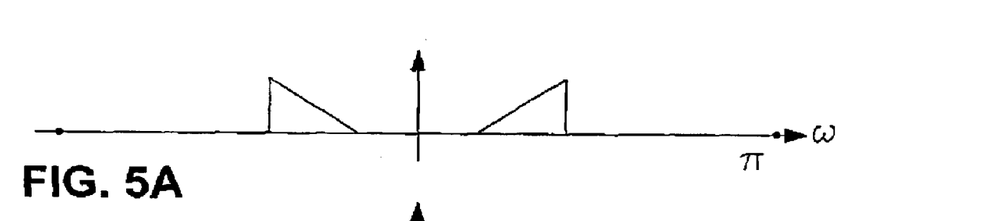
FIGS. 5(a) to 5(d) show the signal spectrum for a single subband at the transmitter of FIG. 3.
Figure 5B:
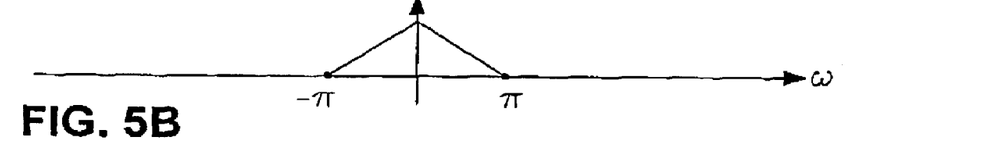

FIG. 3 shows one implementation of transmitter according to one aspect of the invention, where the total frequency band (B) is divided into M sections each with bandwidth $B_s=B/M$ and K of M sub-bands which contain non-zero signal are to be transmitted. In FIG. 3, the signal is first modulated in individual bands and then an N/M point IFFT is applied to each individual band to get the time domain sub-band signal for that band. Each time domain sub-band signal is then upsampled to the desired sampling rate and a bandpass filter is applied to put each sub-band signal into the right location in the total frequency band (see FIGS. 5B to 5D) The sub-band signals then are combined by a summer to form SIGNAL OUT for transmission. The receiver shown in FIG. 4 is the reverse operation of the transmitter shown in FIG. 3.

The received signal SIGNAL IN corresponds to the transmitted signal SIGNAL OUT and so comprises combined sub-band signals. The signal SIGNAL IN is first filtered by the filters FILTER 1, FILTER 2 . . . FILTER K to separate the sub-band signals into individual bands BAND 1. BAND 2 . . . BAND K, respectively, and then each sub-band signal is down sampled. N/M point FFT is applied to each sub-band signal and data is retrieved using QAM demodulation.

Although in the above scheme, the same bandwidth is assumed for all subbands, the bandwidth may vary from one subband to another, with a corresponding variation of FFT size and (up/down) sampling rates. As for the FFT size and filter selection, two different schemes can be used, as described next.

FIG. 5 shows the signal spectrum of the first scheme for a single subband of the transmitter of FIG. 3. FIG. 5(a) is the subband spectrum in the total frequency band which is to be transmitted. FIG. 5(b) is the base band signal of the spectrum of FIG. 5(a) where QAM modulation and IFFT are applied to the data being transmitted. FIG. 5(c) is the upsampled spectrum of FIG. 5(b) where the dashed line shows the filter with a proper frequency response to get the right signal spectrum in the total frequency band, which is again shown in FIG. 5(d).

Figure 5C:
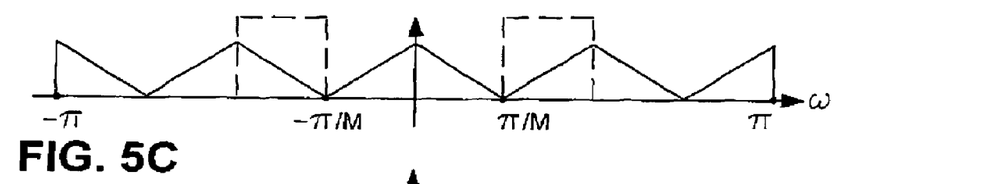
Figure 5D:
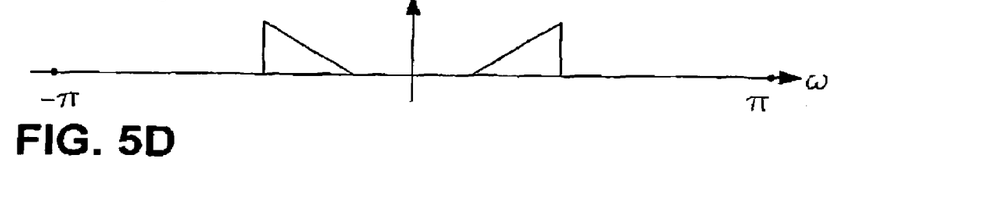
Figure 6A:
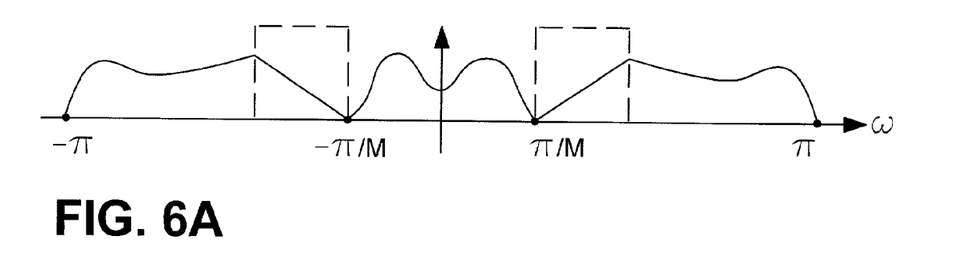
FIG. 6 shows the receiving spectrum of the same subband.
Figure 6B:
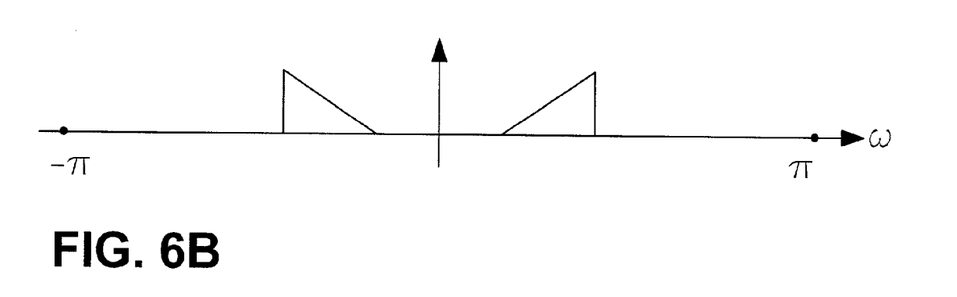
Figure 6C:
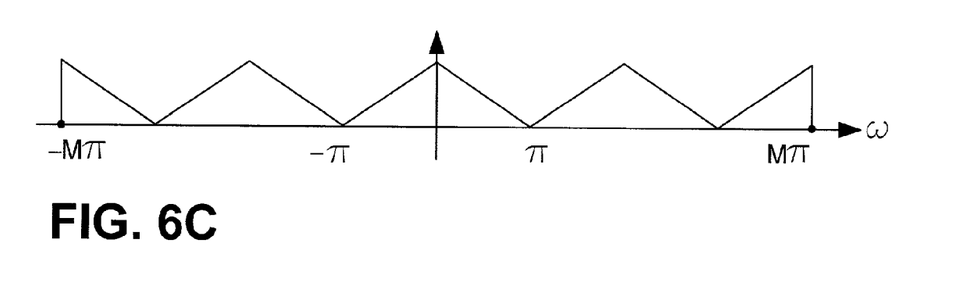

FIG. 6 shows the receiving spectrum of the same subband. FIG. 6(a) is the receiver signal spectrum together with the other subband signal. The dashed line shows the frequency response of the filter to get the proper single subband as shown in FIG. 5(c). FIG. 6(c) shows the down sampled signal spectrum, where FFT and QAM demodulation are applied to the base band signal in the period $[-\pi, \pi]$ to get the receive data.

The advantage of the first scheme is that the filters and the time domain signal are real with a symmetric spectrum. This means that only real signals will be obtained after the IFFT operation in the transmitter and all filter coefficients are real. A disadvantage of the scheme is that the signal subband must be located in the bandwidth $[k*(B/M), (k+1)*(B/M)]$, where B is the maximum frequency in the total frequency band and k=0, 1, . . . , M−1.

Figure 7:
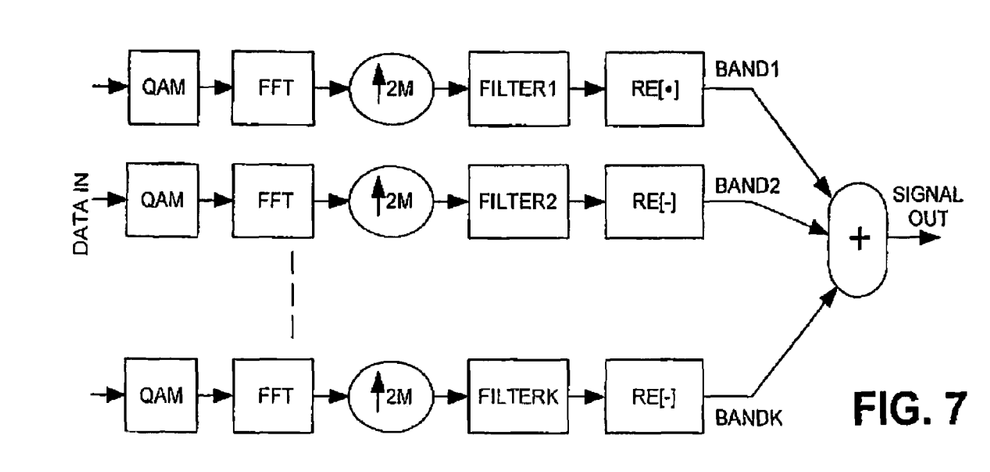
FIG. 7 shows a second embodiment of a transmission system.
Figure 8:
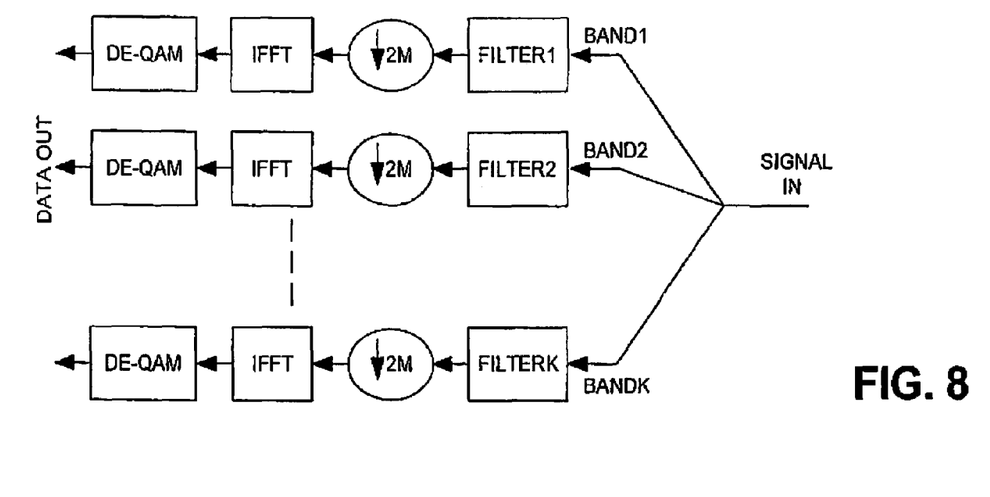
FIG. 8 shows a second embodiment of a receiving system.
Figure 9A:
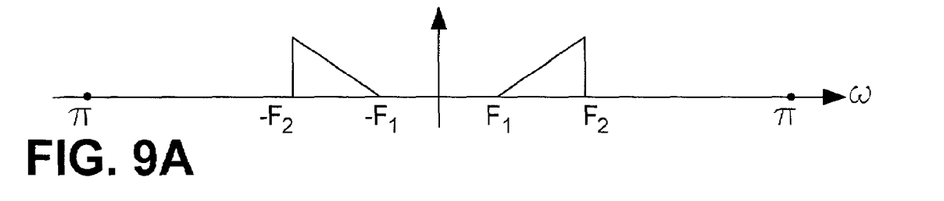
FIG. 9 shows a signal spectrum of the embodiment of FIG. 7.
Figure 9B:
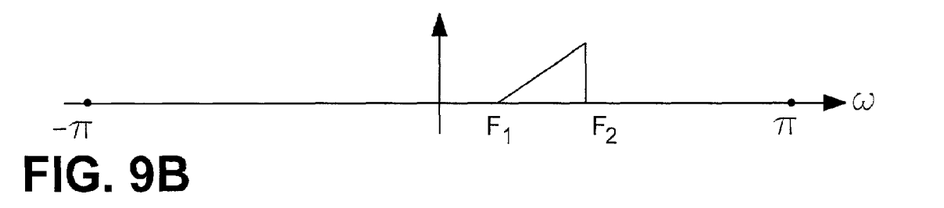
Figure 9C:
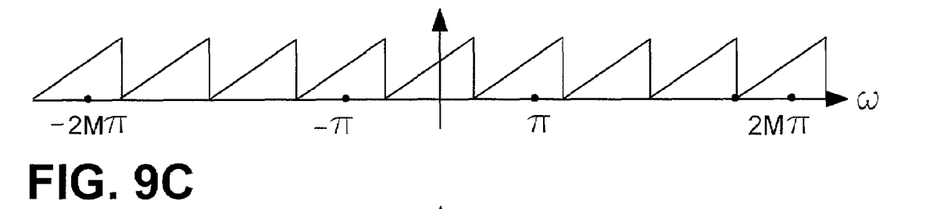
Figure 9D:
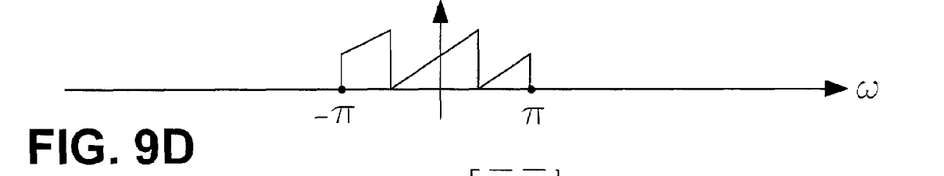
Figure 9E:
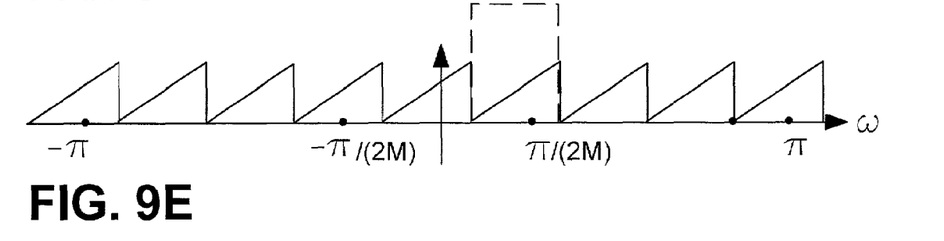
Figure 9F:
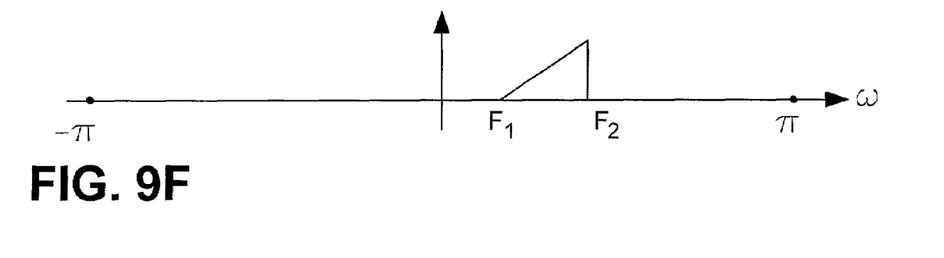
Figure 10A:
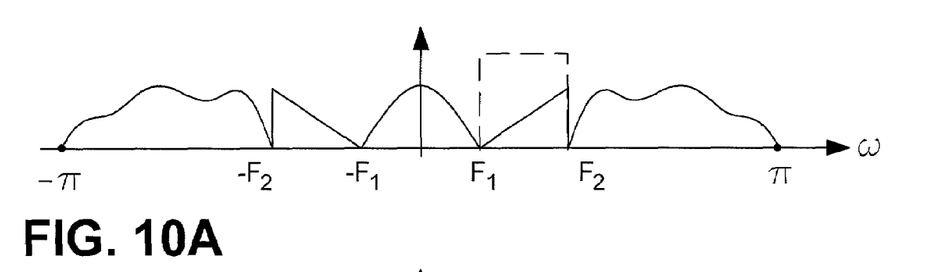
FIG. 10 shows the signal spectrum of the embodiment of FIG. 8.
Figure 10B:
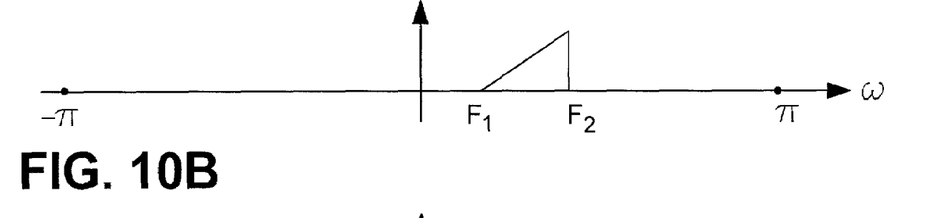
Figure 10C:
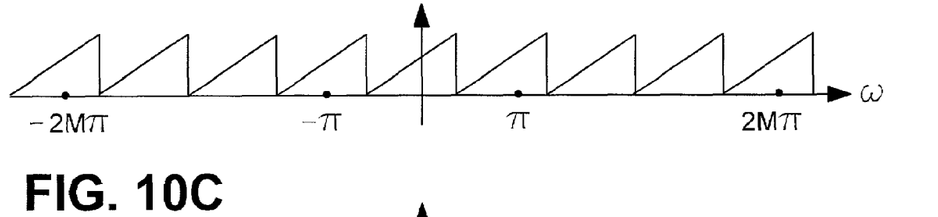
Figure 10D:
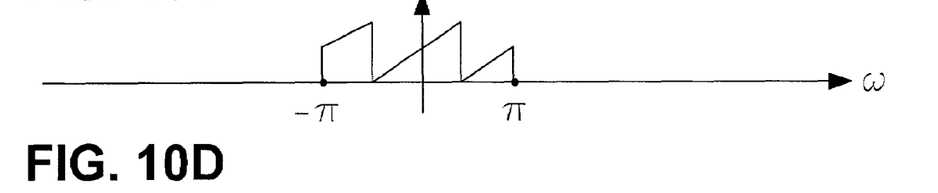

The second scheme is discussed next where signals can be located in any frequency band $[F_1, F_2]$. In this second scheme, FFT is applied to only single sideband spectrum and the other half can be recovered using the symmetrical property. FIG. 7 and FIG. 8 show the transmitter and receiver structures which are very similar to the architecture of FIG. 3 and FIG. 4. The main difference between the schemes is that down/up sampling by M is replaced with down/up sampling by 2M. Also since we are dealing with single side band signal, the filter used is a single side band complex filter and the size of FFT is a N/(2M).

FIG. 9 shows the signal spectrum of the second scheme for the single sub-band of FIG. 7. In this scheme the signal is located in any frequency band $[F_1, F_2]$. FIG. 9(a) is the sub-band spectrum which is to be transmitted in the total frequency band. FIG. 9(b) is single side band signal of FIG. 9(a) and FIG. 9(c) is its down sampled version, Starting with the base band of FIG. 9(c), which is again shown in FIG. 9(d) QAM modulation and IFFT are applied to data based on the spectrum requirement of FIG. 9(d). FIG. 9(e) is the up sampled spectrum and the dashed lines shows the filter with the proper frequency response to get the right single side band signal spectrum of the total frequency band, which is again shown in FIG. 9(f). It is to be noted that the signal spectrum is no longer symmetrical and as a result, both the time domain signal and filter are complex numbers. By taking the real part of the filter output, the symmetrical spectrum of FIG. 9(a) is obtained, Since only the real part of the filter output is transmitted, the computation requirement for the complex filter operation is halved. Also, since FFT is only applied to the single side band spectrum, the size of the FFT is half of that in FIG. 5.

FIG. 10 shows the receiving spectrum of the seine sub-band. FIG. 10(a) is the receiver signal spectrum together with the other sub-band signal. The dashed line shows the frequency response of the filter to get the proper single side band signal as shown in FIG. 10(b). Again, since the input signal is real with a symmetrical spectrum and the single band filter is complex, the computation requirement for complex filter operation is halved. FIG. 10(c) shows the down sampled signal spectrum, where FFT and QAM demodulation are applied to the based band signal in the period [−π, π] to get the receive data. The spectrum in one period [−π, π] is also shown in FIG. 10(d).

The advantages of scheme 2 are that the signal can be located in any frequency band [$F_1$, $F_2$], and the size of FFT is half of that in scheme 1 for the same number of subbands. It is especially suitable for FDM application where only part of the total channel is used for signal transmission. In such case, it is only necessary to process the bands whose time domain signal is non zeros. The only disadvantage is that the complex filter operation is required for both transmitter and receiver. However, as shown before, only half of the complex computation is required, which is only double (instead of four times) the computation of the real filter operation.

While particular embodiments of the invention have been discussed and illustrated it will be apparent to one skilled in the art that numerous alternatives can be introduced without departing from the basic concept. It is to be understood, however, that to the extent possible, such alternatives will fall within the full scope of the invention as defined by the appended claims.

The invention claimed is:

1. A broad bandwidth, high data rate communications system comprising a transmitter employing Inverse Fast Fourier Transform and a receiver employing Fast Fourier Transform, the transmitter having means for dividing the bandwidth into a plurality of sub-bands each for a respective one of a corresponding plurality of sub-band signals, each of the sub-band signals being modulated with a respective portion of input data to be transmitted; and means for performing Inverse Fast Fourier Transform (IFFT) upon the sub-band signals using, for each sub-band signal, a respective one of a plurality of different IFFTs, combining the transformed sub-band signals and transmitting the combined transformed signals to the receiver;

the receiver having means for receiving the combined transformed sub-band signals, separating the sub-band signals and performing forward Fast Fourier Transform thereupon individually using, for each transformed sub-band signal, a respective one of a plurality of different FFTs corresponding to those in the transmitter.

2. A system according to claim 1, wherein the transmitter and receiver each Bather include pass band filters to isolate desired sub-band frequencies.

3. A system according to claim 2, wherein the transmitter has a modulator to process each sub-band separately prior to implementation of the IFFT and up-sampling means in advance of the pass band filter to up-sample each sub-band signal to the desired sampling rate, the receiver having corresponding down-sampling means and a corresponding demodulator.

4. A system according to claim 3, wherein the transmitter and receiver are configured for transmitting and receiving, respectively, Discrete Multi-tone (DMT) signals via a Digital Subscriber Line (DSL).

5. A system according to claim 1, wherein the transmitter and receiver are configured for use with a Very high rate Digital Subscriber Line (VDSL).

6. A transmitter for use in a broad bandwidth, high data rate communications system employing Fast Fourier Transform, the transmitter having means for dividing the bandwidth into a plurality of sub-bands each for a respective one of a corresponding plurality of sub-band signals, each of the sub-band signals being modulated with a respective portion of input data to be transmitted; and means for performing Inverse Fast Fourier Transform (IFFT) upon the sub-band signals using, for each sub-band signal, a respective one of a plurality of different IFFTs, combining the transformed sub-band signals and transmitting the combined transformed signals.

7. A transmitter according to claim 6, further including pass band filters to isolate desired sub-band frequencies.

8. A transmitter according to claim 7, having a modulator to process each sub-band separately prior to implementation of the IFFT and up-sampling means in advance of the pass band filters to up-sample each sub-band signal to the desired sampling rate.

9. A transmitter according to claim 8, configured for transmitting Discrete Multi-tone (DMT) signals via a Digital Subscriber Line (DSL).

10. A transmitter as defined in claim 6, configured for use with a Very high rate Digital Subscriber Line (VDSL).

11. A receiver for use in a broad bandwidth, high data rate communications system, in which signals for transmission are divided into a plurality of sub-band sianals and converted using, for each sub-band signal, a respective one of a plurality of Inverse Fast Fourier Transforms (IFFTs), then combined for transmission, the receiver having:

means for receiving a combined plurality of sub-band signals and separating the plurality of sub-band signals into said corresponding plurality of sub-bands;

and means for performing Fast Fourier Transform upon the received sub-band signals individually using, for each sub-band signal, a respective one of a plurality of different FFTs corresponding to the IFFTs.

12. A receiver according to claim 11, wherein the means for separating the sub-band signals includes a plurality of pass band filters to isolate desired sub-band frequencies.

13. A receiver according to claim 12, for use with received signals comprising combined sub-band signals tat have been modulated separately prior to implementation of the IFFT and up-sampled, the receiver having corresponding down-sampling means and a corresponding demodulator.

14. A receiver according to claim 13, configured for receiving said signals comprising combined sub-band signals in the form of Discrete Multi-tone (DMT) signals via a Digital Subscriber Line (DSL).

15. A receiver according to claim 11, configured for use with a Very high rate Digital Subscriber Line (VDSL).

16. A method of implementing Inverse Fast Fourier Transform and Fast Fourier Transform (FFT) in a broad bandwidth, high data rate communications system comprising a transmitter and a receiver, the method comprising the steps of:

at the transmitter, dividing the bandwidth into a plurality of sub-bands each for a respective one of a corresponding plurality of sub-band signals, each of the sub-band signals being modulated with a respective portion of input data to be transmitted; and performing Inverse Fast Fourier Transform (IFFT) upon the sub-band signals using, for each sub-band signal, a respective one of a plurality of different IFFTs, combining the transformed sub-band signals and transmitting the combined transformed signals to the receiver, and at the receiver, receiving the combined transformed sub-band signals, separating the sub-band signals and performing forward Fast Fourier Transform FFT upon the received transformed sub-band signals individually using, for each sub-band signal, a respective one of a plurality of different FFTs corresponding to those in the transmitter.

17. A method according to claim 16, further including, at each of the transmitter and the receiver, the step of using pass band filters to isolate desired sub-band frequencies.

18. A method according to claim 17, including the step of using a modulator to process each sub-band separately prior to implementation of the FFT.

19. A method according to claim 18, wherein, before said filtering, each sub-band signal is up-sampled to the desired sampling rate.

20. A method according to claim 16, wherein said IFFT and FFT are implemented for only a single side band of said sub-bands.

21. A method according to claim 20, wherein a single side band filter is used.

22. A method according to claim 16, wherein, when the method is used in a frequency division multiplexing application, the bandwidth varies from one subband to another, with a corresponding variation of size of said plurality of different FFTs.

23. A method according to claim 22, wherein up and down sampling rates also vary correspondingly.

24. A method of processing signals for transmission by a transmitter in a broad bandwidth, high data rate communications system employing Inverse Fast Fourier Transform IFFT, the method comprising the steps of dividing the bandwidth into a plurality of sub-bands each for a respective one of a corresponding plurality of sub-band signals, each of the sub-band signals being modulated with a respective portion of input data to be transmitted; and performing Inverse Fast Fourier Transform (IFFT) upon the sub-band signals using, for each sub-band signal, a respective one of a plurality of different IFFTs, combining the transformed sub-band signals and transmitting the combined transformed signals.

25. A method according to claim 24, wherein pass band filters are used to isolate desired sub-band frequencies.

26. A method according to claim 24, wherein a modulator is used to process each sub-band separately prior to implementation of the IFFT and each sub-band signal is up-sampled to the desired sampling rate prior to passband filtering.

27. A method according to claim 24, further comprising the step of transmitting the transformed sub-band signals as Discrete Multi-tone (DMT) signals via a Digital Subscriber Line (DSL).

28. A method according to claim 27, wherein the transformed sub-band signals are transmitted via a Very high rate Digital Subscriber Line (VDSL).

29. A method of processing received signals in a receiver in a broad bandwidth, high data rate communications system employing Fast Fourier Transform (FFT), in which signals for transmission are divided into a plurality of sub-band sianals and convened using, for each sub-band signal, a respective one of a plurality of Inverse Fast Fourier Transforms (IFFTs), then combined for transmission, the receiving method comprising the steps of:

receiving a signal comprising a combined plurality of said sub-band signals separating the subband signals into the corresponding plurality of sub-bands and performing Fast Fourier Transform upon the separated sub-band signals individually using, for each sub-band signal, a respective one of a plurality of different FFTs corresponding to the IFFTs.

30. A method according to claim 29, wherein the sub-band signals are separated by filtering the received signal using a plurality of pass band filters to isolate desired sub-band frequencies.

31. A method according to claim 29, for processing received signals comprising combined sub-band signals that have been modulated separately prior to implementation of the IFFT and up-sampled, the method comprising the steps of down-sampling and demodulating the received sub-band signals using a complementary demodulator and down-sampling rate.

32. A method according to claim 29, wherein said received signal comprising combined sub-band signals is received in the form of discrete Multi-tone (DMT) signals via a Digital Subscriber Line (DSL).

33. A method according to claim 32, wherein said received signal comprising combined sub-band signals is received via a Very high rate Digital Subscriber Line (VDSL).

* * * * *